(12) United States Patent
Matsu Moto et al.

(10) Patent No.: US 6,891,908 B2
(45) Date of Patent: May 10, 2005

(54) PORTABLE RADIO SYSTEM AND PORTABLE RADIO EQUIPMENT TO BE USED IN THE SAME AND FREQUENCY ERROR PREDICTION METHOD USED THEREFOR

(75) Inventors: Mariko Matsu Moto, Tokyo (JP); Shigeru Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 749 days.

(21) Appl. No.: 09/828,861

(22) Filed: Apr. 10, 2001

(65) Prior Publication Data

US 2001/0053192 A1 Dec. 20, 2001

(30) Foreign Application Priority Data

Apr. 19, 2000 (JP) .......................................... 2000-117369

(51) Int. Cl.[7] .......................... H04L 27/06; H04L 27/22; H04B 17/00
(52) U.S. Cl. .......................... 375/344; 375/226; 375/326
(58) Field of Search ................................ 375/344, 326, 375/226

(56) References Cited

U.S. PATENT DOCUMENTS

| | | | | |
|---|---|---|---|---|
| 5,748,682 A | * | 5/1998 | Mobin ........................ | 375/344 |
| 5,872,801 A | * | 2/1999 | Mobin ........................ | 371/43 |
| 5,898,665 A | * | 4/1999 | Sawahashi et al. ......... | 370/342 |
| 6,192,089 B1 | * | 2/2001 | Corleto et al. .............. | 375/344 |
| 6,353,642 B1 | * | 3/2002 | Asahara et al. ............. | 375/344 |
| 6,532,271 B1 | * | 3/2003 | Hwang et al. .............. | 375/326 |
| 6,590,945 B1 | * | 7/2003 | Brardjanian et al. ........ | 375/340 |
| 6,748,026 B1 | * | 6/2004 | Murakami et al. .......... | 375/316 |

FOREIGN PATENT DOCUMENTS

| | | |
|---|---|---|
| JP | H7-235957 | 9/1995 |
| JP | H07-235957 A | 9/1995 |
| JP | 8-307157 | 11/1996 |
| JP | H9-246917 | 9/1997 |
| JP | H11-55338 | 2/1999 |
| JP | H11-127210 | 5/1999 |
| JP | H11-127210 A | 5/1999 |
| JP | H11-168520 | 6/1999 |
| JP | H11-168520 A | 6/1999 |
| JP | 2000-349849 | 12/2000 |
| JP | 2001-85950 | 3/2001 |
| JP | 2001-177592 | 6/2001 |

OTHER PUBLICATIONS

Tomoyuki Watanabe, Masahiko Shimizu, Kouji Matsuyama, Hideto Furukawa, Yoshiharu Tozawa, "AFC Circuits for W–CDMA Mobile Devices," 1998 Institute of Electronics, Information, and Communications Engineers Telecommunications Society General Conference Compendium vol. 1, Sep. 7, 1998, B–5–146, p. 396.

(Continued)

Primary Examiner—Amanda T. Le
Assistant Examiner—Cicely Ware
(74) Attorney, Agent, or Firm—Sughrue Mion, PLLC

(57) ABSTRACT

A portable radio system, a portable radio equipment to be used in the same and a frequency error prediction method can be adapted to large frequency error by making tap number smaller and frequency error smaller. The portable radio system employs an automatic frequency control for detecting a frequency shift of an internal oscillator of a portable radio equipment with reference to a received wave transmitted from a base station having higher precision of frequency and adjusting the frequency of the internal oscillator by feeding back the frequency shift to the internal oscillator. Coordinate rotation digital computation (CORDIC) is employed for calculation of arctangent in the automatic frequency control.

38 Claims, 7 Drawing Sheets

OTHER PUBLICATIONS

Takuya Sakaishi, Takatoshi Aoyagi, Eiji Murai, Makoto Miyake, "Investigations into AFC Methods for W–CDMA Mobile Devices," 1999 Institute of Electronics, Information, and Communications Engineers Telecommunications Society General Conference, Mar. 8, 1999, Telecommunications 1, B–5–115, p. 466.

Takashi Onizawa, Hijiri Kobayashi, Masahiro Morikura, "One Investigation into Error Detection Symbol Switching–type Dual–loop AFC," 1997 Institute of Electronics, Information and Communications Engineers Telecommunications Society General Conference, Aug. 13, 1997, B–5–187, p. 449.

Takuya Sakaishi, Koju Aoyagi, Eiji Murai and Makoto Miyake: Examination of W–CDMA mobile device AFC schemes. 1999 General Conference of the Institute of Electronics, Information and Communication Engineers, Mar. 8, 1999, Communication –1, B–5–115, p. 466.

* cited by examiner

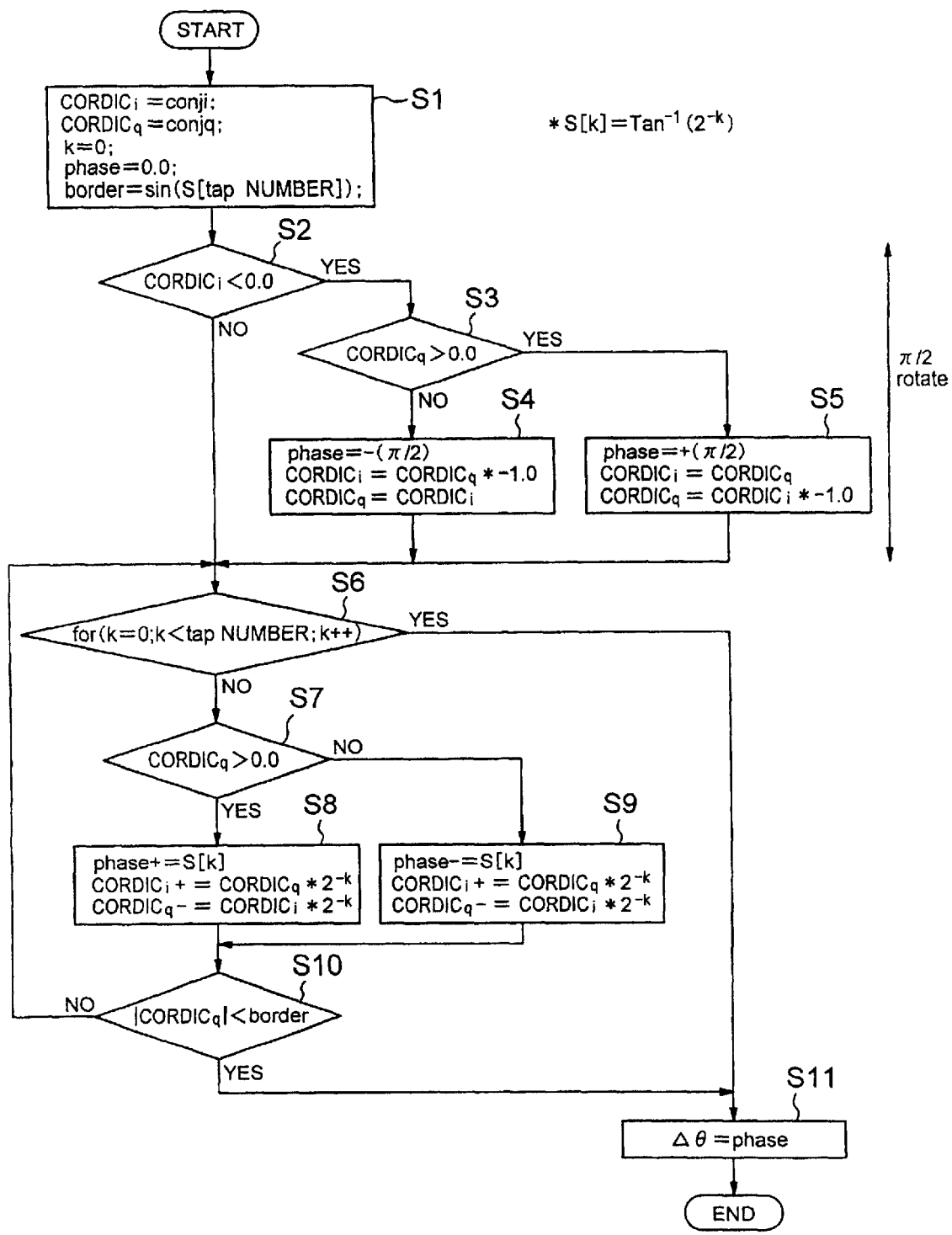

PORTABLE RADIO SYSTEM AND PORTABLE RADIO EQUIPMENT TO BE USED IN THE SAME AND FREQUENCY ERROR PREDICTION METHOD USED THEREFOR

BACKGROUND OF THE INVENTION

1. Field of the Invention

The present invention relates generally to a portable radio system, a portable radio equipment to be used in the same, and a frequency error prediction method to be used therefor. More particularly, the invention relates to a frequency error prediction method in an automatic frequency control (AFC) of a portable radio equipment.

2. Description of the Related Art

In a portable radio equipment (mobile station) as a portable telephone or cellular phone of a system employing QPSK (Quadrature Phase Shift Keying) or WCDMA (Wideband Code Division Multiple Access), as a internal oscillator (mobile station oscillator) of the equipment, oscillators which are inexpensive and lower precision are frequently used for lowering cost.

Therefore, in the mobile station, a frequency shift of the internal oscillator is detected with reference to a reception wave transmitted from a base station having high frequency precision for feeding back to a internal oscillator to perform automatic frequency control (AFC) adapting to a frequency of the internal oscillator.

On the other hand, in order to reduce power consumption and circuit scale, method, such as CORDIC (Coordinate Rotation Digital Computation), is suitable.

In Japanese Unexamined Patent Publication No. Heisei 8-307157, there is disclosed a method for repeated estimation of a phase value and radius value on the basis of an initial in-phase signal and an initial Quadrature signal by using a CORDIC algorithm in a circuit determining the radius value and the phase value from the in-phase signal I(n) and the Quadrature signal Q(n).

In the foregoing portable radio equipment (mobile station), an oscillator which is inexpensive and low precision, is frequently used as an internal oscillator in the equipment for lowering cost. Therefore, automatic frequency control is required. At this time, frequency shift is derived in the following manner.

A phase, derived by multiplying one of two symbols (which are taken at a generation timing of the internal oscillator by receiving a known data, such as modulated pilot signal or the like in a base station,) by a complex conjugate of the other symbol, represents a phase difference of two symbols. In case of the signal, in which two symbols of the known signal are the same phase when the frequency of the internal oscillator is correct, the derived phase shift is divided by an interval of two signals to derive the frequency shift of the internal oscillator.

In the conventional frequency error predicting method, when CORDIC as known method is used in calculation of $\tan^{-1}$ (Arc Tangent) of derived phase shift, only $\pm\pi/2$ can be detected.

In the radio mobile equipment, it is important to reduce a power consumption and size. When a phase calculator such as CORDIC or the like is employed in the radio mobile equipment, tap number of CORDIC is reduced, and error may be caused in derivation of the phase shift.

Upon calculating the frequency shift from the derived phase shift, the phase difference of two symbols used for detection of the phase shift is divided by the interval. Therefore, if the interval of the symbols becomes long, the frequency detection error becomes smaller even when the phase detection error is constant.

However, if the interval is initially set long, when the frequency error is sufficiently large and the absolute value of the phase shift becomes greater than $\pi$, correct frequency error cannot be detected.

SUMMARY OF THE INVENTION

The present invention has been worked out for solving the problem. It is therefore an object of the present invention to provide a portable radio system, a portable radio equipment to be used in the same and a frequency error prediction method which can be adapted to large frequency error by making tap number smaller and frequency error smaller.

According to the first aspect of the present invention, portable radio system employing an automatic frequency control for detecting a frequency shift of an internal oscillator of a portable radio equipment with reference to a received wave transmitted from a base station having higher precision of frequency and adjusting the frequency of the internal oscillator by feeding back the frequency shift to the internal oscillator, wherein coordinate rotation digital computation (CORDIC) is employed for calculation of arctangent in the automatic frequency control.

According to the second aspect of the invention, a portable radio system employing an automatic frequency control for detecting a frequency shift of an internal oscillator of a portable radio equipment with reference to a received wave transmitted from a base station having higher precision of frequency and adjusting the frequency of the internal oscillator by feeding back the frequency shift to the internal oscillator, wherein and portable radio equipment comprises:

calculating means for calculating a phase difference of two symbols taken from a known data modulated by the base station on the basis of a timing generated by the internal oscillator;

frequency shift calculating means for calculating a frequency shift of the internal oscillator by dividing the phase difference derived by the calculating means by an interval of the two symbols; and control means for controlling for widening the interval when the phase difference derived by the calculating means is smaller than a predetermined set value and for narrowing the interval when the phase difference is greater than the set value.

According to the third aspect of the invention, a portable radio system employing an automatic frequency control for detecting a frequency shift of an internal oscillator of a portable radio equipment with reference to a received wave transmitted from a base station having higher precision of frequency and adjusting the frequency of the internal oscillator by feeding back the frequency shift to the internal oscillator, wherein said portable radio equipment comprises:

calculating means for calculating a phase difference of two symbols taken from a known data modulated by the base station on the basis of a timing generated by the internal oscillator;

frequency shift calculating means for calculating a frequency shift of the internal oscillator by dividing the phase difference derived by the calculating means by an interval of the two symbols; and control means for controlling for widening the interval when a value of the frequency shift derived by the frequency shift calculating means is smaller than a predetermined value and for narrowing the interval when the value of the frequency shift is greater than the predetermined value.

The portable radio system as set forth above, is preferably constructed that the two symbols are the same phase when a frequency of the internal oscillator is correct, and the calculating means derives a phase difference of the two symbols by multiplying one of the two symbols by a complex conjugate of another symbol. In practice, upon calculation of arctangent of coordinate rotation digital computation, the frequency shift calculating means may perform calculation within a range of $\pm\pi$. Also, upon performing calculation of the frequency shift, parameters CORDICi and CORDICq are derived by using a calculation of the coordinate rotation digital computation by replacing the signal to be calculated the phase with I and Q components, and in calculation of the coordinate rotation digital computation, when a parameter for outputting a final angle by adding angles per taps is set as phase, in former stage of the coordinate rotation digital computation, a process expressed by:

when CORDICi<0.0 and CORDICq>0.0
CORDICi=CORDICq
CORDICq=CORDICi*−1.0
phase=$\pi/2$
when CORDICi<0.0 and CORDICq<0.0,
CORDICi=CORDICq*−1.0
CORDICq=CORDICi
phase=$-(\pi/2)$ is performed. In the alternative, the upon performing calculation of the frequency shift, parameters CORDICi and CORDICq are derived by using a calculation of the coordinate rotation digital computation by replacing the signal to be calculated the phase with I and Q components, and in calculation of the coordinate rotation digital computation, when a parameter for outputting a final angle by adding angles per taps is set as phase, in former stage of the coordinate rotation digital computation, a process expressed by:

when CORDICi<0.0 and CORDICq>0.0
CORDICi=CORDICi*−1
CORDICq=CORDICq*−1
phase=$\pi$
when CORDICi<0.0 and CORDICq<0.0,
CORDICi=CORDICi*−1
CORDICq=CORDICq*−1
phase=$-\pi$ is performed.

More preferably, the control means may set the interval at a predetermined minimum value when out of synchronization is detected at least from failure of decoding or non-detection of pilot and not reaching of power to a predetermined level.

According to the fourth aspect of the present invention, a portable radio system employing an automatic frequency control for detecting a frequency shift of an internal oscillator of own portable radio equipment with reference to a received wave transmitted from a base station having higher precision of frequency and adjusting the frequency of the internal oscillator by feeding back the frequency shift to the internal oscillator, wherein coordinate rotation digital computation (CORDIC) is employed for calculation of arctangent in the automatic frequency control.

According to the fifth aspect of the present invention, a portable radio equipment employing an automatic frequency control for detecting a frequency shift of an internal oscillator of own portable radio equipment with reference to a received wave transmitted from a base station having higher precision of frequency and adjusting the frequency of the internal oscillator by feeding back the frequency shift to the internal oscillator, comprising calculating means for calculating a phase difference of two symbols taken from a known data modulated by the base station on the basis of a timing generated by the internal oscillator;

frequency shift calculating means for calculating a frequency shift of the internal oscillator by dividing the phase difference derived by the calculating means by an interval of the two symbols; and control means for controlling for widening the interval when the phase difference derived by the calculating means is smaller than a predetermined set value and for narrowing the interval when the phase difference is greater than the set value.

According to the sixth aspect of the invention, a portable radio equipment employing an automatic frequency control for detecting a frequency shift of an internal oscillator of own portable radio equipment with reference to a received wave transmitted from a base station having higher precision of frequency and adjusting the frequency of the internal oscillator by feeding back the frequency shift to the internal oscillator, comprising:

calculating means for calculating a phase difference of two symbols taken from a known data modulated by the base station on the basis of a timing generated by the internal oscillator;

frequency shift calculating means for calculating a frequency shift of the internal oscillator by dividing the phase difference derived by the calculating means by an interval of the two symbols; and control means for controlling for widening the interval when a value of the frequency shift derived by the frequency shift calculating means is smaller than a predetermined value and for narrowing the interval when the value of the frequency shift is greater than the predetermined value.

The portable radio system as set forth above, is preferably constructed that the two symbols are the same phase when a frequency of the internal oscillator is correct, and the calculating means derives a phase difference of the two symbols by multiplying one of the two symbols by a complex conjugate of another symbol. In practice, upon calculation of arctangent of coordinate rotation digital computation, the frequency shift calculating means may perform calculation within a range of $\pm\pi$. Also, upon performing calculation of the frequency shift, parameters CORDICi and CORDICq are derived by using a calculation of the coordinate rotation digital computation by replacing the signal to be calculated the phase with I and Q components, and in calculation of the coordinate rotation digital computation, when a parameter for outputting a final angle by adding angles per taps is set as phase, in former stage of the coordinate rotation digital computation, a process expressed by:

when CORDICi<0.0 and CORDICq>0.0
CORDICi=CORDICq
CORDICq=CORDICi*−1.0
phase=$\pi/2$
when CORDICi<0.0 and CORDICq<0.0,
CORDICi=CORDICq*−1.0
CORDICq=CORDICi
phase=$-(\pi/2)$ is performed.

In the alternative, the upon performing calculation of the frequency shift, parameters CORDICi and CORDICq are derived by using a calculation of the coordinate rotation digital computation by replacing the signal to be calculated the phase with I and Q components, and in calculation of the coordinate rotation digital computation, when a parameter for outputting a final angle by adding angles per taps is set as phase, in former stage of the coordinate rotation digital computation, a process expressed by:

when CORDICi<0.0 and CORDICq>0.0
CORDICi=CORDICi*−1
CORDICq=CORDICq*−1
phase=$\pi$
when CORDICi<0.0 and CORDICq<0.0,
CORDICi=CORDICi*−1
CORDICq=CORDICq*−1
phase=−$\pi$ is performed.

More preferably, the control means may set the interval at a predetermined minimum value when out of synchronization is detected at least from failure of decoding or non-detection of pilot and not reaching of power to a predetermined value.

According the seventh aspect of the present invention, a frequency error predicting method employing an automatic frequency control for detecting a frequency shift of an internal oscillator of portable radio equipment with reference to a received wave transmitted from a base station having higher precision of frequency and adjusting the frequency of the internal oscillator by feeding back the frequency shift to the internal oscillator, wherein coordinate rotation digital computation (CORDIC) is employed for calculation of arctangent in the automatic frequency control.

According to the eighth aspect of the invention portable radio system employing an automatic frequency control for detecting a frequency shift of an internal oscillator of portable radio equipment with reference to a received wave transmitted from a base station having higher precision of frequency and adjusting the frequency of the internal oscillator by feeding back the frequency shift to the internal oscillator, comprises of steps of:

calculating a phase difference of two symbols taken from a known data modulated by the base station on the basis of a timing generated by the internal oscillator;

calculating a frequency shift of the internal oscillator by dividing the phase difference derived by the calculating step by an interval of the two symbols; and controlling for widening the interval when the phase difference derived by the phase difference calculating step is smaller than a predetermined set value and for narrowing the interval when the phase difference is greater than the set value.

According to the ninth aspect of the present invention, a frequency error predicting method employing an automatic frequency control for detecting a frequency shift of an internal oscillator of portable radio equipment with reference to a received wave transmitted from a base station having higher precision of frequency and adjusting the frequency of the internal oscillator by feeding back the frequency shift to the internal oscillator, comprises the steps of:

calculating a phase difference of two symbols taken from a known data modulated by the base station on the basis of a timing generated by the internal oscillator;

calculating a frequency shift of the internal oscillator by dividing the phase difference derived by the calculating step by an interval of the two symbols; and controlling for widening the interval when a value of the frequency shift derived by the frequency shift calculating step is smaller than a predetermined value and for narrowing the interval when the value of the frequency shift is greater than the predetermined value.

Preferably, two symbols are the same phase when a frequency of the internal oscillator is correct, and the phase difference calculating step derives a phase difference of the two symbols by multiplying one of the two symbols by a complex conjugate of another symbol.

In the preferred process, upon calculation of arctangent of coordinate rotation digital computation, the frequency shift calculating step performs calculation within a range of ±$\pi$.

Upon performing calculation of the frequency shift, in the frequency shift calculating step, parameters CORDICi and CORDICq are derived by using a calculation of the coordinate rotation digital computation by replacing the signal to be calculated the phase with I and Q components, and in calculation of the coordinate rotation digital computation, when a parameter for outputting a final angle by adding angles per taps is set as phase, in former stage of the coordinate rotation digital computation, a process expressed by:

when CORDICi<0.0 and CORDICq>0.0
CORDICi=CORDICq
CORDICq=CORDICi*−1.0
phase=$\pi/2$
when CORDICi<0.0 and CORDICq<0.0,
CORDICi=CORDICq*−1.0
CORDICq=CORDICi
phase=−($\pi/2$)

is performed.

In the alternative, upon performing calculation of the frequency shift, in the frequency shift calculating step, parameters CORDICi and CORDICq are derived using a calculation of the coordinate rotation digital computation by replacing the signal to be calculated the phase with I and Q components, and in calculation of the coordinate rotation digital computation, when a parameter for outputting a final angle by adding angles per taps is set as phase, in former stage of the coordinate rotation digital computation, a process expressed by:

when CORDICi<0.0 and CORDICq>0.0
CORDICi=CORDICi*−1
CORDICq=CORDICq*−1
phase=$\pi$
when CORDICi<0.0 and CORDICq<0.0,
CORDICi=CORDICi*−1
CORDICq=CORDICq*−1
phase=−$\pi$ is performed.

The interval controlling step may set the interval at a predetermined minimum value when out of synchronization is detected at least from failure of decoding or non-detection of pilot and not reaching of power to a predetermined level.

Namely, in the portable radio system, the portable radio equipment and the frequency error prediction method according to the present invention, since the internal oscillator typically used in the mobile station has relative low accuracy in frequency for lowering cost, the frequency shift of the internal oscillator in the mobile station is detected with reference to the received wave from the base station having high accuracy of frequency for feeding back to the internal oscillator for adjusting the frequency of the internal oscillator by automatic frequency control (AFC).

Derivation of the frequency shift in the automatic frequency control is performed by deriving the frequency shift of the internal oscillator by receiving the known data such as pilot signal or the like modulated in the base station, deriving the phase difference between two symbols taken at a timing generated by the internal oscillator by multiplying one of two symbols by a complex conjugate of the other symbol, and when two symbols of the known signal are the signals having the same phase when the frequency of the internal oscillator is correct, dividing the derived phase shift by the interval of two signals.

At this time, for calculation of $\tan^{-1}$ (arctangent) of the derived phase shift, the CORDIC (Coordinate Rotation Digital Computation) as known method is used, only $\pm\pi/2$ can be detected. However, in the present invention, only by adding simple circuit and simple process, a range of $\pm\pi$ can be calculated.

In the radio mobile equipment, it is important to reduce power consumption and size. When the phase calculator, such as CORDIC or the like is used in the radio mobile equipment, for reducing tap number of CORDIC, error is caused in derivation of the phase shift.

Upon calculating the frequency shift from the derived phase shift, the phase difference of two symbols used for detection of the phase shift is divided by the interval of the symbols, if the interval is longer, the frequency detection error becomes smaller even when the phase detection error is constant.

However, if the interval is initially set long, accurate frequency shift detection becomes impossible when the frequency shift is sufficiently larger and the absolute value of the phase shift is greater than $\pi$.

Therefore, utilizing original nature of the automatic frequency control, in that the frequency shift becomes smaller by feeding back the frequency error, the interval of two signals to be used for frequency error detection if the frequency error is large, and is set longer when the frequency error becomes smaller. By this, the frequency error can be made small with smaller tap number, and it can be adapted to large frequency error. By this, the equipment achieving low cost and low power consumption can be realized. It should be noted that the accuracy of frequency of the base station is strictly defined, frequency shift between a plurality of base stations is small so as not to influence for control.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to the invention, but are for explanation and understanding only.

In the drawings:

FIG. 3 is a flowchart showing a signal processing in one embodiment of the present invention;

DESCRIPTION OF THE PREFERRED EMBODIMENT

The present invention will be discussed hereinafter in detail in terms of the preferred embodiments of a portable radio system according to the present invention with reference to the accompanying drawings. In the following description, numerous specific details are set forth in order to provide a thorough understanding of the present invention. It will be obvious, however, to those skilled in the art that the present invention may be practiced without these specific detailed.

Figure 1:
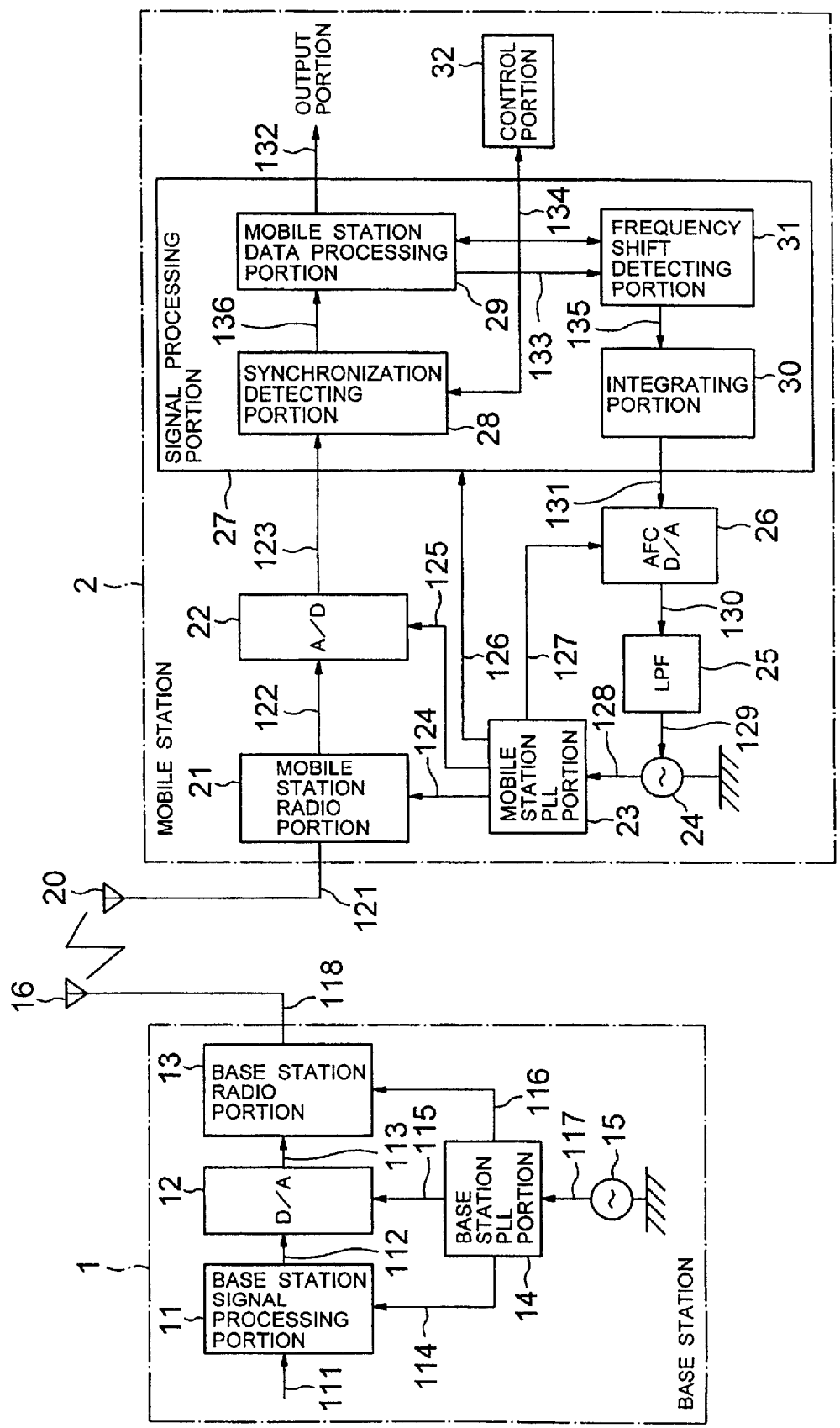
FIG. 1 is a block diagram showing a construction of one embodiment of a portable radio system according to the present invention.

FIG. 1 is a block diagram showing a construction of one embodiment of a portable radio system according to the present invention. In FIG. 1, one embodiment of the portable radio system according to the present invention is generally constructed with a base station 1 and a mobile station 2.

The base station 1 is constructed with a base station signal processing portion 11, D/A (digital-to-analog) converter 12, a base station radio portion, a base station PLL (Phase Locked Loop) portion 14, a base station oscillator 15 having high stability and a base station antenna 16.

The mobile station 2 is constructed with a mobile station radio portion 21, an A/D (analog-to-digital converter) 22, a mobile station PLL portion 23, a mobile station oscillator 24, LPF (low pass filter) 25, an AFC D/A 26, a signal processing portion 27, a control portion 32 constructed with CPU or the like and an output portion (not shown) constructed with a speaker and the like.

The signal processing portion 27 is constructed with a DSP (Digital Signal processor), a gate array, a standard cell and so forth, and is constructed with a synchronization detecting portion 28, a mobile station data processing portion 29, an integrator 30 and a frequency shift detecting portion 31.

In the base station 1, signal 111 is processed by the base station signal processing portion 11 to be output as QPSK (Quadrature Phase Shift Keying) modulated digital signal 112. The QPSK modulated digital signal 112 is converted into an analog signal 113 by the D/A converter 12. Thereafter, the analog signal 113 is subject to Quadrature modulation and up-conversion (118) by the base station radio portion 13, and then transmitted to the base station antenna 16.

At this time, clocks to be used in the base station signal processing portion 11, the D/A converter 12 and the base station radio portion 13 are clocks 114, 115 and 116 generated by frequency conversion of the signal 117 transmitted by the base station oscillator 15 having high stability adapting to clock frequencies of respective portions.

A radio wave transmitted from the base station antenna 16 is received by the mobile station antenna 20 and is transmitted to the mobile station radio portion 21 as a received signal 121. The mobile station radio portion 21 performs down-conversion and Quadrature demodulation to output a QPSK analog signal 122. The QPSK analog signal 122 is converted into a QPSK digital signal 123 by the A/D converter 22 to be input to the synchronization detecting portion 28 of the signal processing portion 27.

The mobile station PLL portion 23 performs frequency conversion of a transmission signal 128 from the mobile station oscillator 24 for providing clocks 124, 125, 126 and 127 to the mobile station radio portion 21, the A/D converter 22, the signal processing portion 27 and the AFC D/A 26, respectively.

Synchronization detection information detected by the synchronization detecting portion 28 is fed to the control portion 32 via a control line 134. The QPSK digital signal 123 passing through the synchronization detecting portion 28 as data 136 is input to the mobile station data processing portion 29.

The mobile station data processing portion 29 performs QPSK demodulation for received data to output a signal 132 to the output portion. On the other hand, the mobile station data processing portion 29 takes out the known QPSK signal 133 to be derived from data 136 (QPSK digital signal) from the synchronization detecting portion 28 and to be used in AFC to transfer to the frequency shift detecting portion 31.

The frequency shift detecting means 31 detects the frequency shift of the mobile station oscillator 24 using the known QPSK signal 133 and the clock signal 126 fed via the mobile station PLL portion 23 from the mobile station oscillator 24 to feed the frequency shift 135 to the integrator 30.

The integrator 30 integrates the frequency shift value at every occurrence to feed a digital signal 131 to AFC D/A 26. The digital signal 131 is converted into an analog signal 130 by the AFC D/A 26. The analog signal 130 is input to an AFC port of the mobile station oscillator 24 through the LPF 25 as frequency shift signal 129.

The mobile station oscillator 24 adjusts oscillation frequency by the frequency shift signal 129 input to the AFC port. Here, the base station oscillator 15 generates the signal having higher accuracy in frequency in comparison with that of the mobile station oscillator 25.

FIGS. 2A to 2E are a diagrammatic illustration showing a transmission format in one embodiment of the present invention. Operation of one embodiment of the present invention will be discussed with reference to FIGS. 2A to 2E.

Figure 2A:
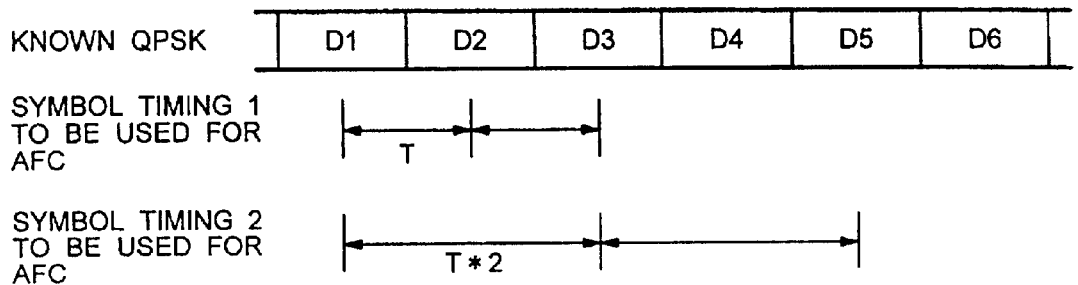
FIGS. 2A to 2E are a diagrammatic illustration showing a transmission format in one embodiment of the present invention.
Figure 2B:
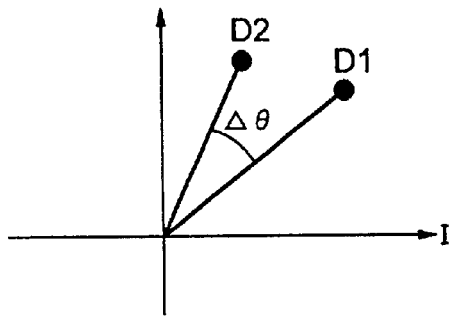

In FIG. 2A, the received known QPSK signals D1, D2, ... are generated at timings generated on the basis of the oscillation signal generated by the base station oscillator 15. The oscillation frequency of the base station oscillator 15 has higher accuracy than that of the mobile station oscillator 24.

On the other hand, since symbol timings 1, 2 to be used in AFC are timings generated on the basis of the transmission signal generated by the mobile station oscillator 23, frequency shift can be caused. The frequency shift is calculated in the following manner. Here, it is assumed that when the frequency of the mobile station oscillator 24 matches with the frequency of the base station oscillator 15, the known QPSK signal becomes the same value.

Figure 2C:
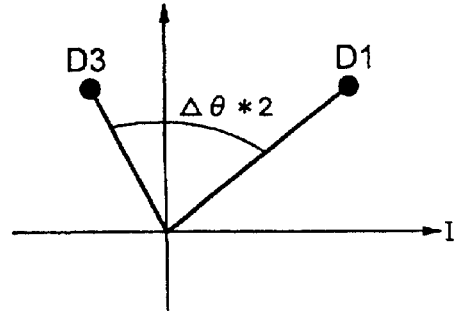
Figure 2D:
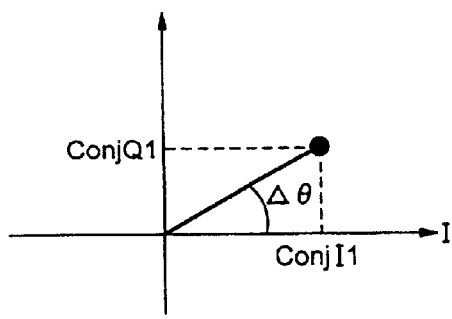
Figure 2E:
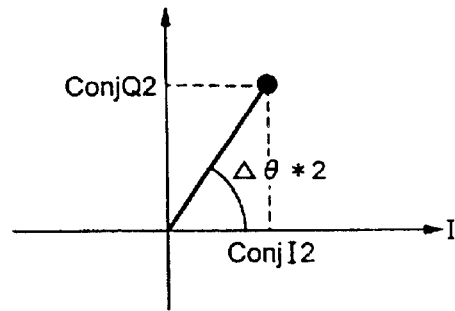

At this time, among two symbols taken at symbol timing 1 (see FIG. 2A) to be used in AFC generated from the mobile station oscillator 24, one symbol is multiplied by complex conjugate of another symbol for deriving a vector (conjI1, conjQ1) as shown in FIG. 2D. The phase of the vector becomes a phase difference of two symbols and becomes a value of $\Delta\theta$ of FIG. 2B. $\Delta\theta$ represents a phase shift caused between an internal T of two symbols caused by frequency shift $\Delta f$.

Accordingly, at the symbol timing 2 used in AFC of FIG. 2A, since interval is T*2, phase shift appearing becomes A $\theta$*2 (see FIG. 2C). Accordingly, the frequency shift $\Delta f$ is expressed by:

$$\Delta f = \Delta\theta / 2\pi * \text{Interval} \qquad (1)$$

$$= (1 / 2\pi * \text{Interval}) * \tan^{-1}(conjQ/conjI)$$

By showing in the foregoing expression (1), by dividing the derived phase shift $\Delta\theta$ by an interval of two signals, the frequency shift $\Delta f$ of the mobile station oscillator 24 can be derived.

FIG. 3 is a flowchart showing a signal processing in one embodiment of the present invention. Operation of one embodiment of the present invention will be discussed with reference to FIG. 3. Here, the signal processing shown in FIG. 3 shows an example for enabling calculation of $\tan^{-1}$ within a range of $\pm\pi$ it by using CORDIC for calculation of $\tan^{-1}$ (ArcTangent) in the expression (1) and using $\pm(\pi/2)$ rotate (phase rotation, it 180°).

Replacing CORDICi and CORDICq used in calculation with the input signals conjI and conjQ, a parameter k to be used for counting of number of tap and a value of phase to be used for phase calculation are initialized, and sin (S (tap number)) is set in a value of border (step S1 of FIG. 3). At this time, $S[k]=\tan^{-1}(2^{-k})$. The tap number is predetermined value.

Next, when CORDICi is negative number (CORDICi<0.0) (step S2 of FIG. 3), since an absolute value of the phase to be calculated is $\pi/2$, check is performed whether CORDICq is positive value or negative value (step S3 of FIG. 3).

When CORDICq is positive (CORDICq<0.0), a phase of the signal expressed by (CORDICi, CORDICq) is rotated over $-(\pi/2)$, and $+(\pi/2)$ is replaced for phase (step S5 of FIG. 3). When CORDICq is negative (CORDICq<0.0), phase of the signal indicated by (CORDICi, CQRDICq) is rotated over $+(\pi/2)$ and $-(\pi/2)$ is replaced for phase (step S4 of FIG. 3).

At this time, $-(\pi/2)$ rotation of the phase is expressed by:

$$\text{CORDICi} = \text{CORDICq} \qquad (2)$$

$$\text{CORDICq} = \text{CORDICi}*-1.0 \qquad (3)$$

On the other hand, $+(\pi/2)$ rotation of the phase is expressed by:

$$\text{CORDICi} = \text{CORDICq}*-1.0 \qquad (4)$$

$$\text{CORDICq} = \text{CORDICi} \qquad (5)$$

These equations exchange signals CORDICi and CORDICq and invert sign. Therefore, it can be realized with quite simple hardware.

Subsequently, by performing calculation of the phase within a range of about $\pm(\pi/2)$ on the basis of the method of CORDIC, calculation of $\tan^{-1}$ of the phase of about $\pm\pi$ is realized. CORDIC method is expressed by:

$$\begin{bmatrix} CORDICi \\ CORDICq \end{bmatrix} = \frac{1}{\cos(\theta_k)} \begin{bmatrix} \cos(\theta_k) & D_k \sin(\theta_k) \\ -D_k \sin(\theta_k) & \cos(\theta_k) \end{bmatrix} \begin{bmatrix} CORDICi \\ CORDICq \end{bmatrix} \qquad (6)$$

$$\theta_k = \tan^{-1}(2^{-k})$$

$$D_k = 1[I_{in,k} < 0]$$

$$D_k = -1[I_{out,k} \leq 0] \qquad (7)$$

$$\text{phase} = -1 * \Sigma D_k * \theta_k \qquad (8)$$

Here, $\Sigma$ in the foregoing equation (8) is total of k=1 to tap. The process expressed by the foregoing equations (6) to (8) are the processes at steps S6, S7, S8 and S9 of FIG. 3.

Discussing the process operation expressed by the equations (6) to (8), when CORDIC q is positive value (CORDICq>0.0) (step S7 of FIG. 3), the phase of the signal is rotated over $-[2^{-k}*(\pi/4)]$, and $[2^{-k}*(\pi/4)]$ is added to phase (step S8 of FIG. 3).

When CORDIC q is negative value (CORDICq<0.0) (step S7 of FIG. 3), the phase of the signal is rotated over +[$2^{-k}*(\pi/4)$], and −[$2^{-k}*(\pi/4)$] is added to phase (step S9 of FIG. 3). The foregoing processes S6 to S10 are repeated for number of times corresponding to the tap number. Thus, calculation of $\tan^{-1}$ of the phase within a range of about ±($\pi/2$) can be performed.

On the other hand, when the absolute value of CORDICq is smaller than the value of border, since error obtained by a predetermined tap number is already satisfied, calculation is interrupted in the process thereof to output the value of the phase (step S10 of FIG. 3).

This is a measure for reducing power consumption by omitting extra calculation. At this time, the derived value of phase becomes a value of the phase shift Δθ in the foregoing equation (1) (Δθ=phase) (step S11 of FIG. 3).

Figure 4:
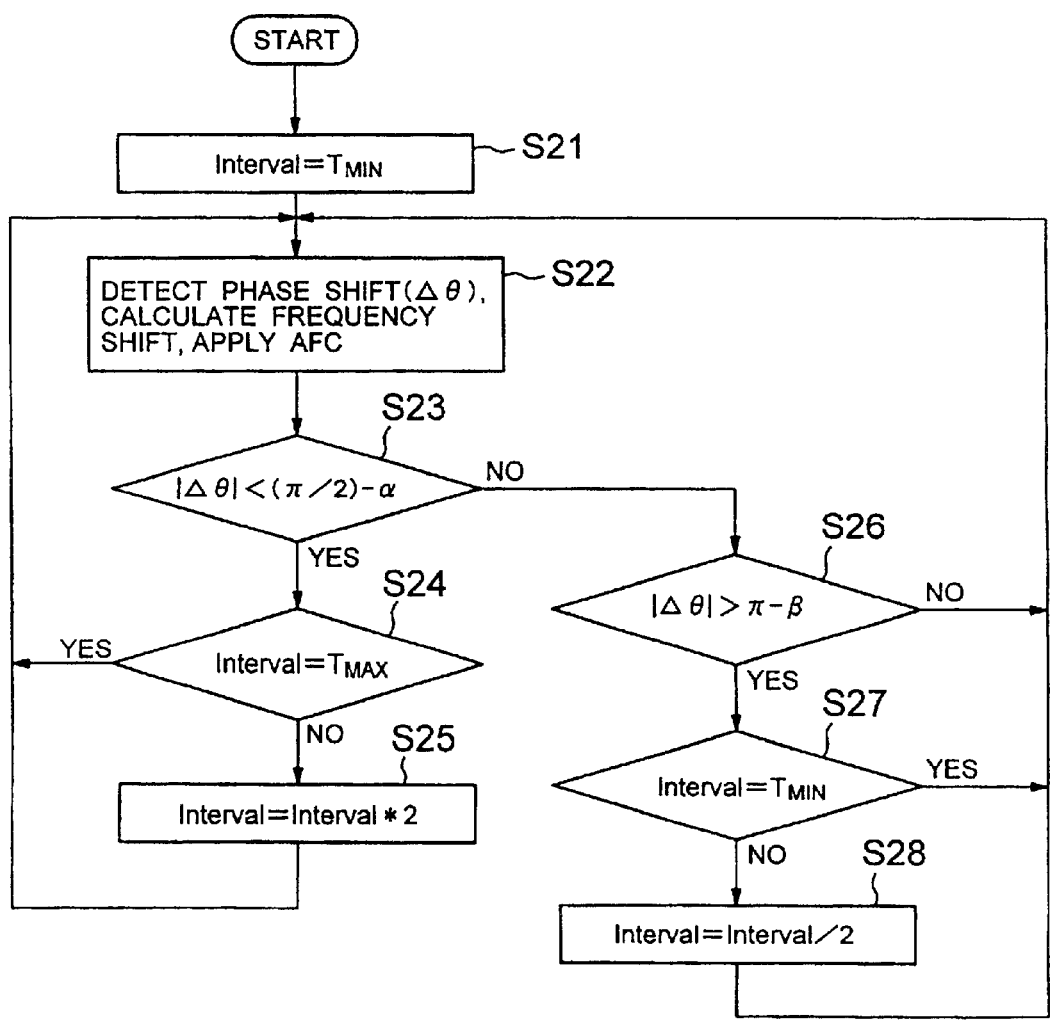
FIG. 4 is a flowchart showing a control of one embodiment of the present invention.

FIG. 4 is a flowchart showing control in one embodiment of the present invention. Operation of one embodiment of the present invention will be discussed with reference to FIG. 4.

Operation of AFC is initiated normally upon turning ON of power source for the mobile station. The mobile station oscillator 23 causes shifting of frequency for influence of secular change of temperature characteristics or the like. The control portion 32 of the mobile station 2 sets a value of Interval (interval T of FIG. 2) at a minimum value $T_{MIN}$ of the predetermined interval (step S21 of FIG. 4). This minimum value $T_{MIN}$ is determined by symbol rate or the like of the radio system.

Since $\tan^{-1}$ used upon frequency shift calculation can be calculated only within a range of ±π, if the frequency shift Δf to be derived from the foregoing equation (1) falls out of −(½*interval)<Δf<(½*interval) [Hz], the phase shift becomes out of a range of −π<Δθ<π to cause error in calculation of the frequency shift Δf. In order to avoid this, upon initiation of AFC operation where the frequency shift Δf is the largest, the minimum value is set as Interval.

Next, detection of phase shift (Δθ) is performed. For this purpose, the method illustrated in FIGS. 2A to 2E and FIG. 3 and the foregoing equation (1) is used. Namely, two symbols are taken from the received known QPSK signal at a timing where the clock is generated from the mobile station oscillator 24. By multiplying one of the symbols by complex conjugate of another symbol (as FIG. 2) taken with an internal of Interval, a phase of the signal of the product is derived using CORDIC (see FIG. 3). Furthermore, by the equation (1), the frequency shift Δf is calculated.

Subsequently, through an integrator 30, AFC is applied to the mobile station oscillator 24 (step S22 of FIG. 4). Detection is made whether an absolute value of the derived phase shift Δθ is smaller than [($\pi/2$)−α](|Δθ|<($\pi/2$)−α) (step S23 of FIG. 4).

At this time, α is a predetermined margin derived with taking a fluctuation of the value of the frequency shift Δf so that the next detected phase shift Δθ may not be out of the range of ±π even when Interval becomes double.

When the absolute value of the phase shift Δθ is smaller than [($\pi/2$)−α] and the value of the Interval is not the predetermined maximum value $T_{MAX}$ of Interval (step S24 of FIG. 4), Interval is widened by multiplying by 2 (step S25 of FIG. 4). The value of the maximum value $T_{MAX}$ is determined with taking the fact that, in certain condition of propagation path of radio wave, error should be caused in detection of frequency when Interval is set to be excessively large, When absolute value of the phase shift Δθ is greater than or equal to [($\pi/2$)−α], and is greater than π−β, (|Δθ|>π−β) (step S26 of FIG. 4), and when the value of Interval is not the minimum value $T_{MIN}$ (step S27 of FIG. 4), the value of Interval is made half (step S28 of FIG. 4). At this time, β is a predetermined margin provided in order to make judgment that the input phase is greater than π and the absolute value of the phase shift Δθ currently calculated can be obtained by erroneous calculation, since derivation of the phase can be performed correct calculation only within the range of ±π.

By repeating this operation, adapting to the case where the frequency shift Δf is reduced by AFC operation from a timing that the frequency shift Δf of the mobile station oscillator 24 is still large upon initiation of AFC, Interval may be made greater.

The maximum value of the absolute value of the quantization error upon derivation of the phase shift Δθ is considered as [$2^{-tap}*(\pi/4)$](tap=tap number). While tap number is to reduced in order to reduce power consumption in the mobile station 2, reduction of tap number caused increase of quantization error. However, from the equation (1), the frequency shift Δf is expressed by:

$$\Delta f = \Delta\theta / 2\pi * \text{Interval}$$

Influence for the frequency shift Δf of the quantization error of the phase shift Δθ can be reduced by making Interval greater.

As set forth above, by one embodiment of the present invention, it can be adapted to large frequency shift Δf and AFC at higher precision can be performed with smaller tap number.

Figure 5:
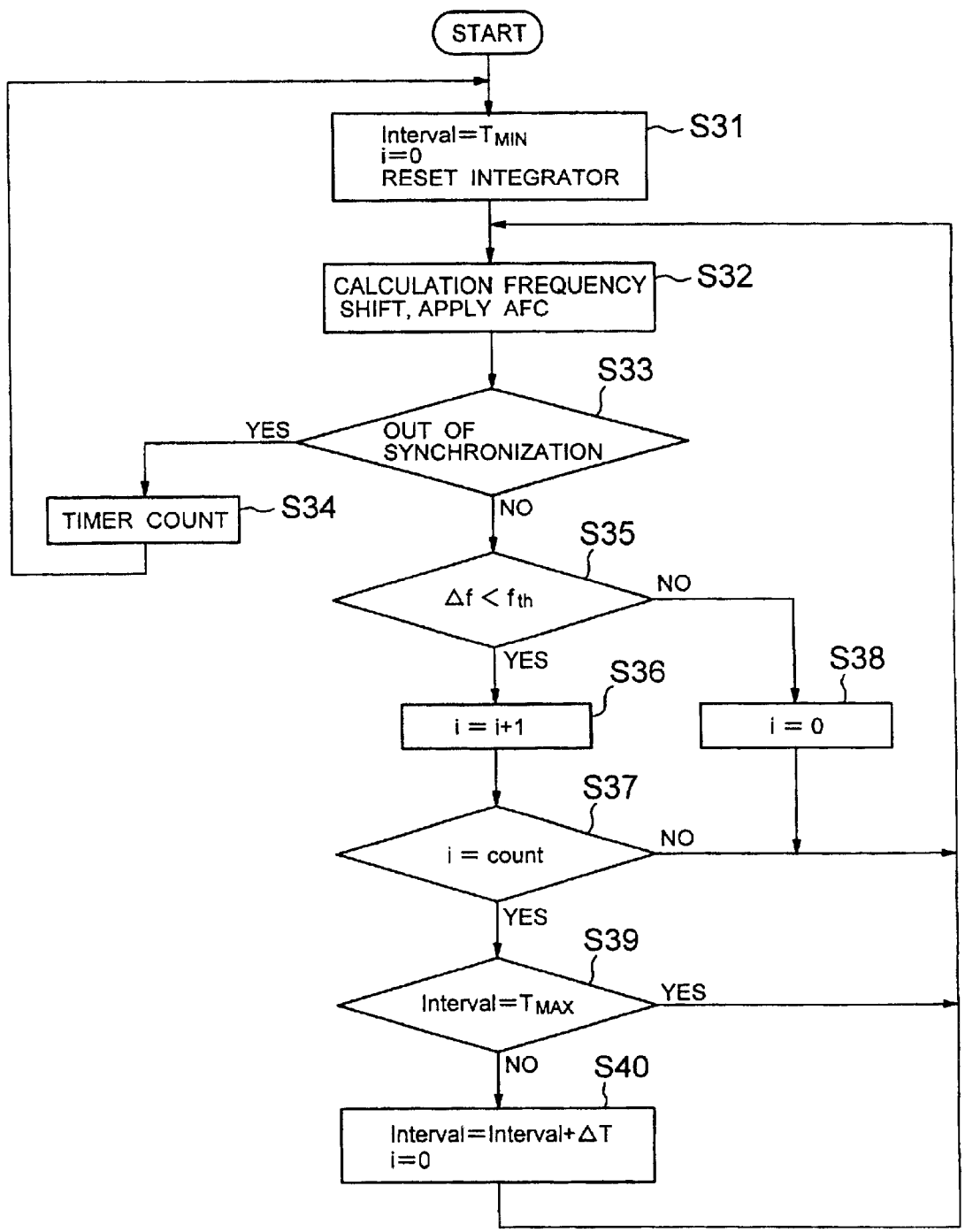
FIG. 5 is a flowchart showing a control of one embodiment of the present invention.

FIG. 5 is a flowchart showing a control in one embodiment of the present invention. Control operation of one embodiment of the present invention will be discussed with reference to FIG. 5.

Upon initiation of AFC operation, the power source of the mobile station 2 is normally ON. The mobile station oscillator 24 is shifted the frequency due to influence of secular change or the like of the temperature characteristics. The control portion 32 of the mobile station 2 initially set Interval (interval T of FIG. 2) at the predetermined minimum value $T_{MIN}$ of the interval. This minimum value $T_{MIN}$ is determined depending upon a symbol rate or the like of the radio system.

The reason why Interval is set the minimum value $T_{MIN}$ upon initiation of AFC operation where the frequency shift Δf is considered to be largest, since calculation of $\tan^{-1}$ cannot be done only within the range of ±π upon calculation of the frequency shift (Δf), for avoiding erroneous derivation of the frequency shift Δf when the frequency shift Δf to be derived becomes out of a range of −(½*interval<Δf< (½*interval)[Hz].

Furthermore, a parameter i to be used for counting number of times of occurrence of out of synchronization is initialized, and the value of the integrator 30 is reset (step S31 of FIG. 5). An output $f_{AFC}$=ΣΔf (Δf is an output of frequency shift detecting portion 31). Here, $A_{AFC}$ is assumed to be zero.

Next, detection of the frequency shift (Δf) is performed. For this, a method shown in FIGS. 2A to 2E, 3, 4 and equation (1) is used. Namely, two symbols are taken from the received known QPSK signal at a timing where the clock is generated from the mobile station oscillator 24. By multiplying one of the symbols by complex conjugate of another symbol (see FIG. 2) taken with an internal of Interval, a phase of the signal of the product is derived using CORDIC (see FIG. 3). Furthermore, by the equation (1), the frequency shift Δf is calculated.

Subsequently, the frequency shift (Δf) is output and is added as AFC signal to the mobile station oscillator 24 through the integrator 30 to apply AFC (step S32 of FIG. 5).

Next, out of synchronization is detected (step S33 of FIG. 5). This can be detected by detecting a fact that the reception signal cannot be decoded or known data, such as pilot or the like cannot be detected in the synchronization detecting portion 28, or a power level cannot reach a given value, and transmitted to the control portion 32 and the frequency shift detecting portion 31.

In case of out of synchronization, the control portion 32 actuates a not shown timer to provide a time interval (step S34 in FIG. 5), and again initialize Interval, the parameter i and the value of the integrator 30 (step S31 of FIG. 5) to continue the foregoing operation.

If not out of synchronization, check is performed wether the derived value of the frequency shift Δf is smaller than a predetermined value $f_{th}$ or not (Δf<$f_{th}$) (step S35 of FIG. 5). If not smaller, 0 is set to the parameter i (step S38 of FIG. 5), and frequency shift Δf is detected again.

If smaller, the parameter i is incremented by 1 (i=i+1) (step S36 of FIG. 5). Check is performed whether the value of the parameter i is equal to a predetermined value (count). If the value of the parameter i is equal to the predetermined value (count) (step S37 of FIG. 5), and when value of Interval is not the maximum value $T_{MAX}$ (step S39 of FIG. 5), a predetermined value ΔT is added to the value of Interval to widen Interval, and the value of the parameter i is set to 0 (step S40 of FIG. 5).

If the maximum value $T_{MAX}$ is determined with taking into account the case where error may be caused in detection of frequency if Interval is set excessively large depending upon condition of the propagation path of the radio wave.

By these operation, when the frequency shift Δf becomes stable, Interval is widen to obtain precision. At the occurrence of out of synchronization, Interval is widened to adapt to wide range frequency shift Δf.

As set forth above, when CORDIC which is well-known method is used for calculation of $\tan^{-1}$ in calculation of the phase shift Δθ, calculation with the range of ±π can be performed by merely adding simple circuit or process.

On the other hand, utilizing the nature of AFC for reducing the frequency shift Δf by performing feeding back, when the frequency error is large, the interval of two signals to be used for detection of frequency error is made shorter, and when frequency error becomes smaller, the interval is controlled to be longer for obtaining small frequency error with small tap number and for adapting to large frequency error. It should be noted that since the precision of the frequency of the base station 1 is defined by strict standard and frequency shift between a plurality of base stations is small and may not influence for the foregoing control.

Figure 6:
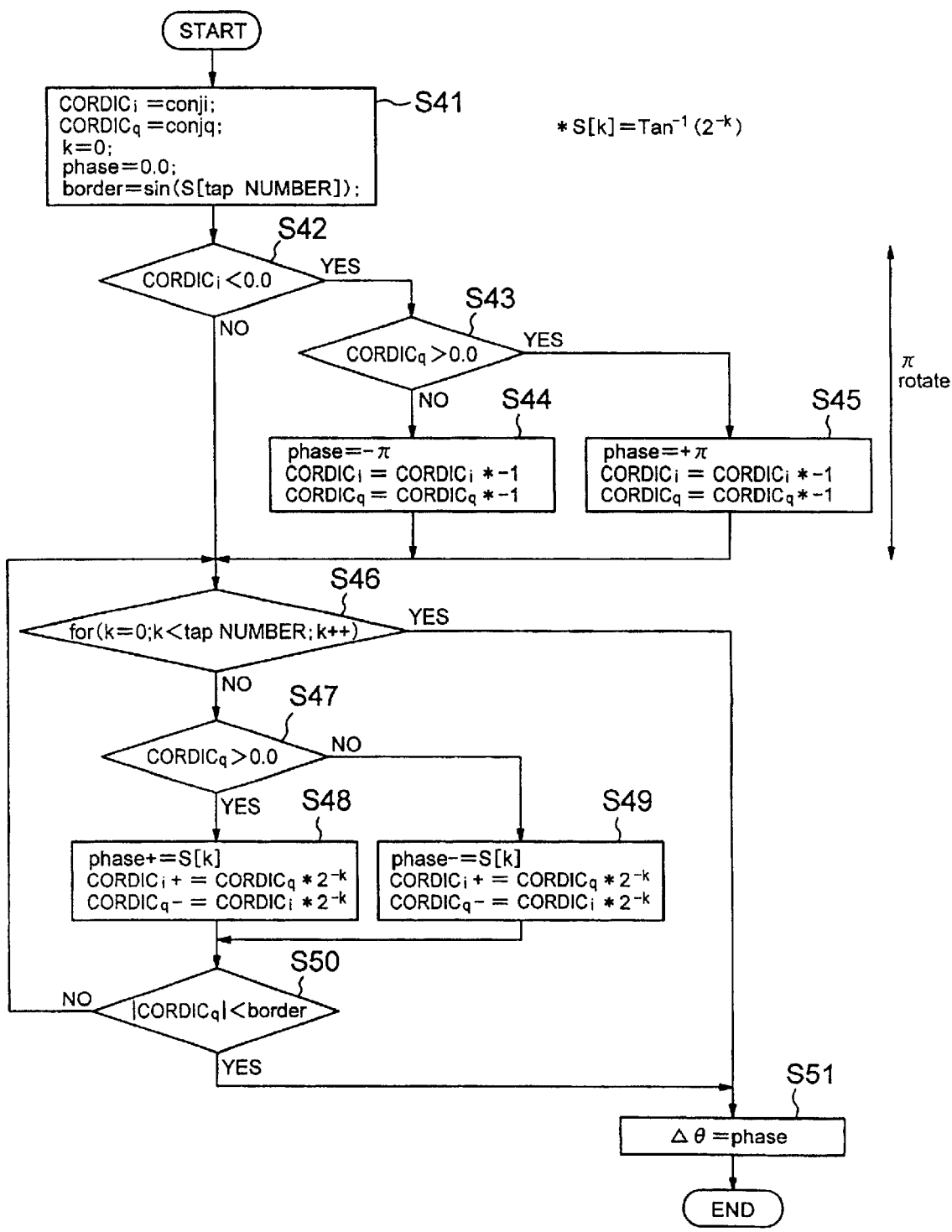
FIG. 6 is a flowchart showing a signal processing in another embodiment of the present invention.

FIG. 6 is a flowchart of signal processing in another embodiment of the present invention. Operation of another embodiment of the present invention will be discussed with reference to FIG. 6. Here, the signal processing shown in FIG. 6 is an example enabling calculation of $\tan^{-1}$ within the range of ±π using CORDIC in calculation of $\tan^{-1}$ (ArcTangent) in the foregoing equation (1) and using ±π rotate (phase rotation: π=180°).

Replacing CORDICi and CORDICq used in calculation with the input signals conjI and conjQ, the parameter k to be used for counting tap number and the value of phase used in calculation of phase are initialized, and sin (S[tap number]) is set in the value of border (step S41 of FIG. 6). At this time, S[k]=$\tan^{-1}(2^{-k})$, and the tap number is a predetermined value.

Next, when the CORDICi is negative number (CORDICi<0.0) (step S42 of FIG. 6), since an absolute value of the phase to be calculated is greater than or equal to π/2, check is performed whether CORDICq is positive value or negative value (step S43 of FIG. 6).

When CORDICq is positive (CORDICq>0.0), the phase of the signal represented by (CORDICi, CORDICq) is rotated for −π, and phase is replaced with +(step S45 of FIG. 6). When the CORDICq is negative (CORDICq<0.0), the phase of the signal represented by (CORDICi, CORDICq) is rotated for +π and phase is replaced with −π (step S44 of FIG. 6).

At this time, rotation of −π of the phase can be realized by simple expression of:

$$\text{CORDICi}=\text{CORDICi}*-1 \qquad (9)$$

$$\text{CORDICq}=\text{CORDICq}*-1 \qquad (10)$$

On the other hand, rotation of +π of the phase can be realized by simple expression of:

$$\text{CORDICi}=\text{CORDICi}*-1 \qquad (11)$$

$$\text{CORDICq}=\text{CORDICq}*-1 \qquad (12)$$

These equations only invert signs of the signals of CORDICi and CORDICq. Therefore, these can be realized by quite simple hardware. Subsequent process operation of steps S46 to S51 are similar to process operation of steps S6 to S11 of one embodiment of the present invention. Therefore, discussion for these steps will be omitted in order to avoid redundant disclosure and whereby to keep the disclosure simple enough to facilitate clear understanding of the present invention.

Figure 7:
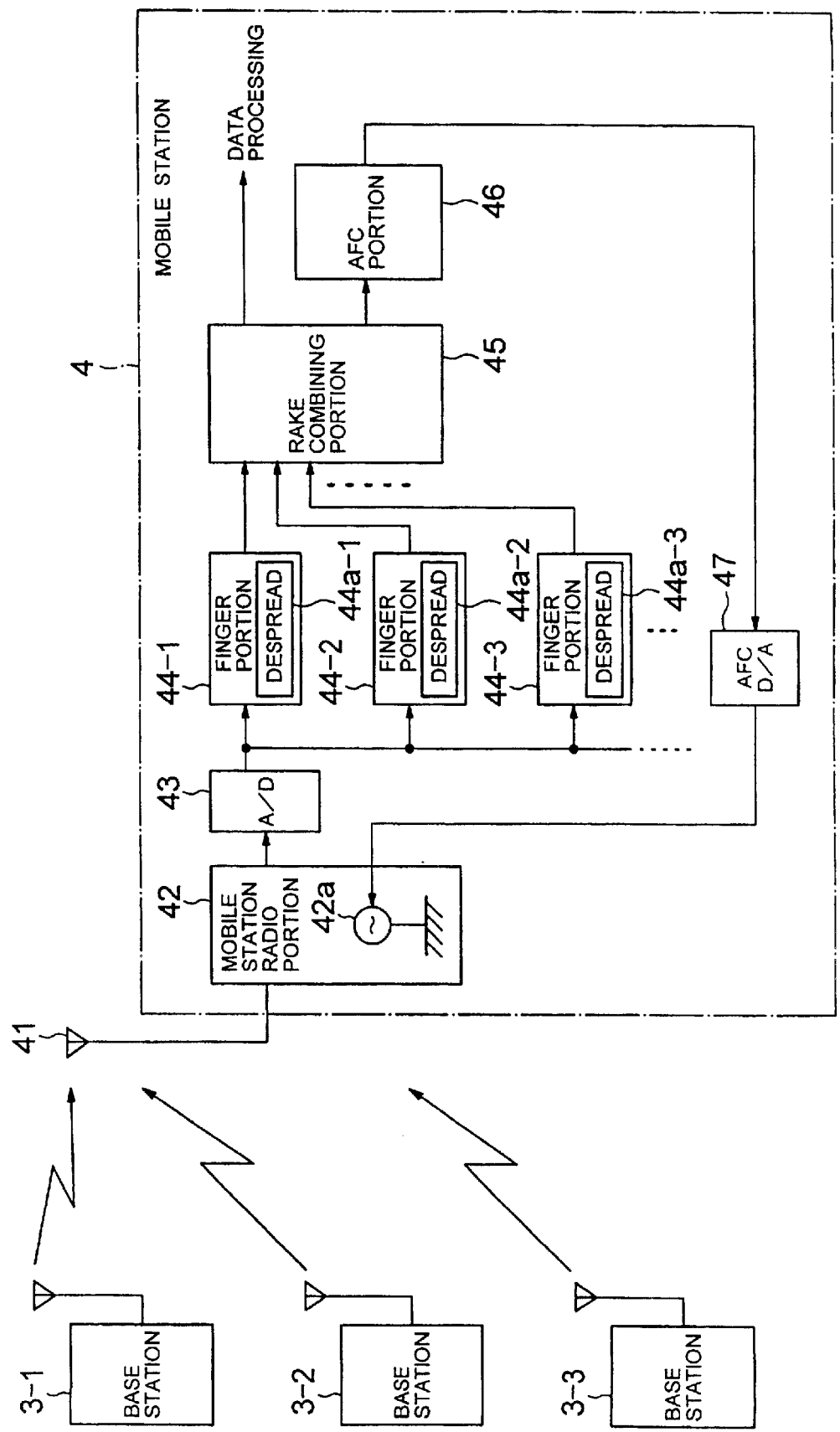
FIG. 7 is a block diagram showing a construction of another embodiment of the portable radio system according to the present invention.

FIG. 7 is a block diagram showing a construction of another embodiment of a portable radio system according to the present invention. In FIG. 7, the portable radio system of another embodiment of the present invention is constructed with a plurality of base stations 3-1 to 3-3 and the mobile station 4. It is noted that the mobile station 4 slowly moves within cells of a plurality of base stations 3-1 to 3-3.

Each of the base stations 3-1 to 3-3 has the same construction as the base station 1 of the former embodiment of the present invention. Therefore, discussion for construction and operation will be omitted in order to avoid redundant disclosure and whereby to keep the disclosure simple enough to facilitate clear understanding of the present invention. The mobile station 4 has a mobile station antenna 41, a mobile station radio portion 42, an A/D (analog-to-digital) converter 43, a finger portions 44-1, 44-2, 44-3 . . . , a Rake combining portion 45, an AFC portion 46, an AFC D/A 47.

The mobile station radio portion 42 has a mobile station oscillator 42a. The finger portions 44-1, 44-2, 33-3, . . . respectively have despreading portions 44a-1, 44a-2, 44a-3, . . . and a power calculating portion which is not shown. A power value calculated by the power calculating portion is weighted respective and output.

The radio wave transmitted from respective antenna of the base stations 3-1 to 3-3 are received by the mobile station antenna 41. The received signal is fed to the mobile station radio portion 42. The QPSK analog signal down-converted and quadrature demodulated from the line frequency by the mobile station radio portion 42 is converted into the QPSK digital signal by the A/D converter 43 and then input to the fiber portions 44-1, 44-2, 44-3, . . . .

The finger portions 44-1, 44-2, 44-3, . . . despread the signals received at respective timing by the despreading portions 44a-1, 44a-2, 44a-3, . . . to output to the Rake combining portion 45. At this time, the signals from the finger portions 44-1, 44-2, 44-3, . . . to the Rake combining portion 45 are weighted depending upon the power values respectively calculated by the power calculating portions. Namely, the signals from the finger portions 44-1, 44-2, 44-3, . . . to the Rake combining portion 45 are weighted per the base stations 3-1 to 3-3.

The Rake combining portion 45 combines respective signals of the finger portions 44-1, 44-2, 44-3, . . . to be output to a not shown data processing portion and the AFC portion 46. The AFC portion 46 performs AFC using CORDIC in calculation of $\tan^{-1}$ of calculation of the phase shift $\Delta\theta$ similarly to the former embodiment of the invention, and AFC D/A 47 performs conversion from the digital signal from the AFC portion 46 into the analog signal to output as the frequency shift signal to the AFC portion of the mobile station oscillator 42$a$.

The mobile station oscillator 42$a$ adjusts the oscillation frequency by the frequency shift signal input to the AFC port. Here, the base station oscillator generates the signal having higher accuracy in frequency in comparison with that of the mobile station oscillator 42. By this, in addition to the foregoing effect, even when the mobile station 4 moves within the cells of respective of a plurality of base stations 3-1 to 3-3 slowly, it can be adapted to respective frequencies of the base stations 3-1 to 3-3.

With the present invention set forth above, in the portable radio system, in which the frequency shift of the internal oscillator of the portable radio equipment is detected with reference to the received wave transmitted from the base station having higher precision in frequency, and by feeding back the frequency shift to the internal oscillator, the frequency is adjusted by using automatic frequency control, a phase difference of two symbols taken from the known data modulated in the base station on the basis of the timing generated in the internal oscillator, the frequency shift of the internal oscillator is derived by dividing derived phase difference by an interval of two symbols to perform control for widening the interval when the derived phase difference is smaller than the predetermined set value and to shorten the interval when the phase difference is greater than the predetermined set value to adapt to large frequency error.

Although the present invention has been illustrated and described with respect to exemplary embodiment thereof, it should be understood by those skilled in the art that the foregoing and various other changes, omission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

What is claimed is:

1. A portable radio system comprising:

an internal oscillator; and an automatic frequency control for detecting a frequency shift of said internal oscillator with reference to a received wave transmitted from a base station and adjusting a frequency of said internal oscillator by feeding back said frequency shift to said internal oscillator, wherein coordinate rotation digital computation (CORDIC) is employed for calculation of arctangent in said automatic frequency control; and wherein, upon performing calculation said detecting of said frequency shift comprises deriving parameters CORDICi and CORDICq said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq<0.0

CORDICi=CORDICq

CORDICq=CORDICi*−1.0 phase=$\pi/2$ when CORDICi<0.0 and CQRDICq<0.0,

CORDICi=CORDICq*−1.0

CORDICq=CORDICi phase=$-(\pi/2)$ is performed.

2. A portable radio system comprising:

an internal oscillator; and an automatic frequency control for detecting a frequency shift of said internal oscillator with reference to a received wave transmitted from a base station and adjusting a frequency of said internal oscillator by feeding back said frequency shift to said internal oscillator, wherein coordinate rotation digital computation (CORDIC) is employed for calculation of arctangent in said automatic frequency control; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0

CORDICi=CORDICi*−1

CORDICq=CORDICq*−1 phase=$\pi$ when CORDICi<0.0 and CORDICq<0.0,

CORDICi=CORDICi*−1

CORDICq=CORDICq*−1 phase=$-\pi$ is performed.

3. A portable radio system employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises;

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when said phase difference derived by said calculating means is smaller than a predetermined set value, and for narrowing said interval when said phase difference is greater than said set value;

wherein said two symbols are the same phase when a frequency of said internal oscillator is correct, and said calculating means derives a phase difference of said two symbols by multiplying one of said two symbols by a complex conjugate of another symbol;

wherein upon calculation of arctangent by employing coordinate rotation digital computation (CORDIC), said frequency shift calculating means performs calculation within a range of $\pm\pi$; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*−1.0
phase=$\pi/2$
when CORDICi<0.0 and CORDICq<0.0,
CORDICi=CORDICq*−1.0
CORDICq=CORDICi
phase=−($\pi/2$)

is performed.

4. A portable radio system employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises;

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when said phase difference derived by said calculating means is smaller than a predetermined set value, and for narrowing said interval when said phase difference is greater than said set value;

wherein said two symbols are the same phase when a frequency of said internal oscillator is correct, and said calculating means derives a phase difference of said two symbols by multiplying one of said two symbols by a complex conjugate of another symbol;

wherein upon calculation of arctangent by employing coordinate rotation digital computation (CORDIC), said frequency shift calculating means performs calculation within a range of $\pm\pi$; and wherein said detecting of said frequency shift comprises deriving parameters CORDICi and CORDICq by said coordinate rotation digital computations, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=$\pi$
when CORDICi<0.0 and CORDICq<0.0,
CORDICi=CORDICi*−1
CORDICq=CORDICq*−1
phase=−$\pi$ is performed.

5. A portable radio system employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises;

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when said phase difference derived by said calculating means is smaller than a predetermined set value, and for narrowing said interval when said phase difference is greater than said set value; and wherein said control means sets said interval at a predetermined minimum value when out of synchronization is detected due to one of a failure to decode or to detect a pilot and a failure of power to reach a predetermined level.

6. A portable radio system employing an automatic frequency control for defecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises:

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when a value of said frequency shift derived by said frequency shift calculating means is smaller than a predetermined value and for narrowing said interval when said value of said frequency shift is greater than said predetermined value;

wherein said two symbols are the same phase when a frequency of said internal oscillator is correct, and said calculating means derives a chase difference of said two symbols by multiplying one of said two symbols by a complex conjugate of another symbol;

wherein upon calculation of arctangent of coordinate rotation digital computation (CORDIC), said frequency shift calculating means performs calculation within a range of $\pm\pi$; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*−1.0
phase=π/2
when CORDICi<0.0 and CORDICq<0.0,
CORDICi=CORDICq*−1.0
CORDICq=CORDICi
phase=−(π/2)
is performed.

7. A portable radio system employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises:

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when a value of said frequency shift derived by said frequency shift calculating means is smaller than a predetermined value and for narrowing said interval when said value of said frequency shift is greater than said predetermined value;

wherein said two symbols are the same phase when a frequency of said internal oscillator is correct, and said calculating means derives a phase difference of said two symbols by multiplying one of said two symbols by a complex conjugate of another symbol;

wherein upon calculation of arctangent of coordinate rotation digital computation (CORDIC), said frequency shift calculating means performs calculation within a range of ±π; and wherein said detection of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=
when CORDICi<0.0 and CORDICq<0.0,
CORDICi=CORDICi*−1
CORDICq=CORDICq*−1
phase=−π
is performed.

8. A portable radio system employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises:

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when a value of said frequency shift derived by said frequency shift calculating means is smaller than a predetermined value and for narrowing said interval when said value of said frequency shift is greater than said predetermined value; and wherein said control means sets said interval at a predetermined minimum value when out of synchronization is detected due to one of a failure to decode or to detect a pilot and a failure of power to reach a predetermined level.

9. A portable radio equipment comprising:

an internal oscillator; and an automatic frequency control for detecting a frequency shift of said internal oscillator with reference to a received wave transmitted from a base station and adjusting a frequency of said internal oscillator by feeding back said frequency shift to said internal oscillator, wherein coordinate rotation digital computation (CORDIC) is employed for calculation of arctangent in said automatic frequency control; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*−1.0
phase=π/2
when CORDICi<0.0 and CORDICq<0.0,
CORDICi=CORDICq*−1.0
CORDICq=CORDICi
phase=−(π/2)
is performed.

10. A portable radio equipment comprising:

an internal oscillator; and an automatic frequency control for detecting a frequency shift of said internal oscillator with reference to a received wave transmitted from a base station and adjusting a frequency of said internal oscillator by feeding back said frequency shift to said internal oscillator, wherein coordinate rotation digital computation (CORDIC) is employed for calculation of arctangent in said automatic frequency control; and wherein said detecting of said frequency shift comprises deriving parameters CORDICi and CORDICq by said coordinate rotation digital computation, where a signal whose phase is to be calculated the phase with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=π
when CORDICi<0.0 and CORDICq<0.0,
CORDICi=CORDICi*−1
CORDICq=CORDICq*−1
phase=−π
is performed.

11. A portable radio equipment employing an automatic frequency control for detecting a frequency shift of an internal oscillator of own portable radio equipment with reference to a received wave transmitted from a base station and adjusting the frequency of said internal oscillator by feeding back said frequency shift to said internal oscillator, comprising:

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when said phase difference derived by said calculating means is smaller than a predetermined set value and for narrowing said interval when said phase difference is greater than said set value;

wherein said two symbols are the same phase when a frequency of said internal oscillator is correct, and said calculating means derives a phase difference of said two symbols by multiplying one of said two symbols by a complex conjugate of another symbol;

wherein upon calculation of arctangent by employing coordinate rotation digital computation, said frequency shift calculating means performs calculation within a range of ±π; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

A frequency error predicting method when CORDICi<0.0 and CORDICq>0.0
CORDICi=CORDICq
CORDICq=CORDICi*−1.0
phase=π/2 when CORDICi<0.0 and CORDICq<0.0,
CORDICi=CORDICq*−1.0
CORDICq=CORDICi
phase=−(π/2)
is performed.

12. A portable radio equipment employing an automatic frequency control for detecting a frequency shift of an internal oscillator of own portable radio equipment with reference to a received wave transmitted from a base station and adjusting the frequency of said internal oscillator by feeding back said frequency shift to said internal oscillator, comprising:

calculating means for calculating a phase difference of two symbols taken from a known data modulated by said base station on the basis of a timing generated by said internal oscillator;

frequency shift calculating means for calculating a frequency shift of said internal oscillator by dividing said chase difference derived by said calculating means by an interval of said two symbols; and control means for widening said interval when said phase difference derived by said calculating means is smaller than a predetermined set value and for narrowing said interval when said phase difference is greater than said set value;

wherein said two symbols are the same phase when a frequency of said internal oscillator is correct, and said calculating means derives a phase difference of said two symbols by multiplying one of said two symbols by a complex conjugate of another symbol;

wherein upon calculation of arctangent by employing coordinate rotation digital computation, said frequency shift calculating means performs calculation within a range of ±π; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=π
when CORDICi<0.0 and CORDICq<0.0,
CORDICi=CORDICi*−1
CORDICq=CORDICq*−1
phase=−π
is performed.

13. A portable radio equipment employing an automatic frequency control for detecting a frequency shift of an internal oscillator of own portable radio equipment with reference to a received wave transmitted from a base station and adjusting the frequency of said internal oscillator by feeding back said frequency shift to said internal oscillator, comprising:

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when said phase difference derived by said calculating means is smaller than a predetermined set value and for narrowing said interval when said phase difference is greater than said set value; and wherein said control means sets said interval at a predetermined minimum value when out of synchronization is detected due to one of a failure to decode or to detect a pilot and a failure of power to reach a predetermined level.

14. A portable radio equipment employing an automatic frequency control for detecting a frequency shift of an internal oscillator of own portable radio equipment with reference to a received wave transmitted from a base station and adjusting the frequency of said internal oscillator by feeding back said frequency shift to said internal oscillator, comprising:

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when a value of said frequency shift derived by said frequency shift calculating means is smaller than a predetermined value and for narrowing said interval when said value of said frequency shift is greater than said predetermined value;

wherein upon calculation of arctangent by employing coordinate rotation digital computation, said frequency shift calculating means performs calculation within a range of $\pm\pi$; and wherein said detecting of said frequency shift comprises deriving parameters CORDICi and CORDICq by said coordinate rotation digital computation, where a signal whose phase is to be calculated is replaced with I and Q components, and in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*-1.0
phase=$\pi/2$
when CORDICi<0.0 and CORDICq<0.0,
CORDICi=CORDICq*-1.0
CORDICq=CORDICi
phase =$-(\pi/2)$ is performed.

15. A portable radio equipment employing an automatic frequency control for detecting a frequency shift of an internal oscillator of own portable radio equipment with reference to a received wave transmitted from a base station and adjusting the frequency of said internal oscillator by feeding back said frequency shift to said internal oscillator, comprising:

calculating means for calculating a phase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when a value of said frequency shift derived by said frequency shift calculating means is smaller than a predetermined value and for narrowing said interval when said value of said frequency shift is greater than said predetermined value;

wherein upon calculation of arctangent by employing coordinate rotation digital computation, said frequency shift calculating means performs calculation within a range of $\pm\pi$; and wherein said detecting of said frequency shift comprises deriving parameters CORDICi and CORDICq by said coordinate rotation digital computation, where a signal whose phase is to be calculated is replace with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICi*-1
CORDICq=CORDICq*-1
phase=$\pi$
when CORDICi<0.0 and CORDICq<0.0,
CORDICi=CORDICi*-1
CORDICq=CORDICq*-1
phase=$-\pi$ is performed.

16. A portable radio equipment employing an automatic frequency control for detecting a frequency shift of an internal oscillator of own portable radio equipment with reference to a received wave transmitted from a base station and adjusting the frequency of said internal oscillator by feeding back said frequency shift to said internal oscillator, comprising:

calculating means for calculating a chase difference of two symbols taken from a known data modulated by said base station on the basis of a timing generated by said internal oscillator;

frequency shift calculating means for calculating a frequency shift of said internal oscillator by dividing said phase difference derived by said calculating means by an interval of said two symbols; and control means for widening said interval when a value of said frequency shift derived by said frequency shift calculating means is smaller than a predetermined value and for narrowing said interval when said value of said frequency shift is greater than said predetermined value; and wherein said control means sets said interval at a predetermined minimum value when out of synchronization is detected due to one of a failure to decode or to detect a pilot and a failure of power to reach a predetermined level.

17. A frequency error predicting method comprising:

detecting, employing an automatic frequency control, a frequency shift of an internal oscillator of portable radio equipment with reference to a received wave transmitted from a base station; and adjusting the frequency of said internal oscillator by feeding back said frequency shift to said internal oscillator, wherein coordinate rotation digital computation (CORDIC) is employed for calculation of arctangent in said automatic frequency control;

wherein, upon calculation of arctangent, calculation is performed within a range of ±π; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*−1.0
phase=π/2
when CORDICi<0.0 and CORDICq<0.0,
CORDICi=CORDICq*−1.0
CORDICq=CORDICi
phase=−(π/2)

is performed.

18. A frequency error predicting method comprising:

detecting, employing an automatic frequency control, a frequency shift of an internal oscillator of portable radio equipment with reference to a received wave transmitted from a base station; and adjusting the frequency of said internal oscillator by feeding back said frequency shift to said internal oscillator, wherein coordinate rotation digital computation (CORDIC) is employed for calculation of arctangent in said automatic frequency control;

wherein, upon calculation of arctangent, calculation is performed within a range of ±π; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=π
when CORDICi<0.0 and CORDICq<0.0,
CORDICi=CORDICi*−1
CORDICq=CORDICq*−1
phase=−π is performed.

19. A frequency error predicting method employing an automatic frequency control for detecting a frequency shift of an internal oscillator of portable radio equipment with reference to a received wave transmitted from a base station and adjusting the frequency of said internal oscillator by feeding back said frequency shift to said internal oscillator, comprising of steps of:

calculating a phase difference of two symbols taken from a known data modulated by said base station on the basis of a timing generated by said internal oscillator;

calculating a frequency shift of said internal oscillator by dividing said phase difference derived by said calculating step by an interval of said two symbols; and widening said interval when said phase difference derived by said phase difference calculating step is smaller than a predetermined set value and narrowing said interval when said phase difference is greater than said set value;

wherein upon calculation of arctangent of coordinate rotation digital computation, said frequency shift calculating step performs calculation within a range of ±π; and wherein said frequency shift calculating step further comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*−1.0
phase=π/2
when CORDICi<0.0 and CORDICq<0.0,
CORDICi=CORDICq*−1.0
CORDICq=CORDICi
phase=−(π/2)

is performed.

20. A frequency error predicting method employing an automatic frequency control for detecting a frequency shift of an internal oscillator of portable radio equipment with reference to a received wave transmitted from a base station and adjusting the frequency of said internal oscillator by feeding back said frequency shift to said internal oscillator, comprising of steps of:

calculating a phase difference of two symbols taken from a known data modulated by said base station on the basis of a timing generated by said internal oscillator;

calculating a frequency shift of said internal oscillator by dividing said phase difference derived by said calculating step by an interval of said two symbols; and widening said interval when said chase difference derived by said phase difference calculating step is smaller than a predetermined set value and narrowing said interval when said phase difference is greater than said set value;

wherein upon calculation of arctangent of coordinate rotation digital computation, said frequency shift calculating step performs calculation within a range of ±π; and wherein said frequency shift calculating step further comprises deriving parameters CORDICi and CORDICq by said coordinate rotation digital computation, where a signal whose phase is to be calculated is replaced with I and Q components, and in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=π
when CORDICi<0.0 and CORDICq<0.0,
CORDICi=CORDICi*−1
CORDICq=CORDICq*−1
phase=−π
is performed.

21. A frequency error predicting method employing an automatic frequency control for detecting a frequency shift of an internal oscillator of portable radio equipment with reference to a received wave transmitted from a base station and adjusting the frequency of said internal oscillator by feeding back said frequency shift to said internal oscillator, comprising of steps of:
calculating a phase difference of two symbols taken from a known data modulated by said base station on the basis of a timing generated by said internal oscillator;
calculating a frequency shift of said internal oscillator by dividing said phase difference derived by said calculating step by an interval of said two symbols; and
widening said interval when said phase difference derived by said phase difference calculating step is smaller than a predetermined set value and narrowing said interval when said phase difference is greater than said set value; and
wherein said interval controlling step sets said interval at a predetermined minimum value when out of synchronization is detected due to one of a failure to decode or to detect a pilot and a failure of power to reach a predetermined level.

22. A frequency error predicting method employing an automatic frequency control for detecting a frequency shift of an internal oscillator of portable radio equipment with reference to a received wave transmitted from a base station and adjusting the frequency of said internal oscillator by feeding back said frequency shift to said internal oscillator, comprising the steps of:
calculating a phase difference of two symbols taken from a known data modulated by said base station on the basis of a timing generated by said internal oscillator;
calculating a frequency shift of said internal oscillator by dividing said phase difference derived by said calculating step by an interval of said two symbols; and
widening said interval when a value of said frequency shift derived by said frequency shift calculating step is smaller than a predetermined value and for narrowing said interval when said value of said frequency shift is greater than said predetermined value;
wherein upon calculation of arctangent of coordinate rotation digital computation, said frequency shift calculating step performs calculation within a range of ±π; and
wherein said frequency shift calculating step further comprises deriving parameters CORDICi and CORDICq by said coordinate rotation digital computation, where a signal whose phase is to be calculated is replaced with I and Q components, and
in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*−1.0
phase=π/2
when CORDICi<0.0 and CORDICq<0.0,
CORDICi=CORDICq*−1.0
CORDICq=CORDICi
phase=−(π/2)
is performed.

23. A frequency error predicting method employing an automatic frequency control for detecting a frequency shift of an internal oscillator of portable radio equipment with reference to a received wave transmitted from a base station and adjusting the frequency of said internal oscillator by feeding back said frequency shift to said internal oscillator, comprising the steps of:
calculating a phase difference of two symbols taken from a known data modulated by said base station on the basis of a timing generated by said internal oscillator;
calculating a frequency shift of said internal oscillator by dividing said phase difference derived by said calculating step by an interval of said two symbols; and
widening said interval when a value of said frequency shift derived by said frequency shift calculating step is smaller than a predetermined value and for narrowing said interval when said value of said frequency shift is greater than said predetermined value;
wherein upon calculation of arctangent of coordinate rotation digital computation, said frequency shift calculating step performs calculation within a range of ±π; and
wherein said frequency shift calculating step further comprises deriving parameters CORDICi and CORDICq by said coordinate rotation digital computation, where a signal whose phase is to be calculated is replaced with I and Q components of said signal, and
in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=π
when CORDICi<0.0 and CORDICq<0.0,
CORDICi=CORDICi*−1
CORDICq=CORDICq*−1
phase=−π
is performed.

24. A frequency error predicting method employing an automatic frequency control for detecting a frequency shift of an internal oscillator of portable radio equipment with reference to a received wave transmitted from a base station and adjusting the frequency of said internal oscillator by feeding back said frequency shift to said internal oscillator, comprising the steps of:
calculating a phase difference of two symbols taken from a known data modulated by said base station on the basis of a timing generated by said internal oscillator;
calculating a frequency shift of said internal oscillator by dividing said phase difference derived by said calculating step by an interval of said two symbols; and widening said interval when a value of said frequency shift derived by said frequency shift calculating step is smaller than a predetermined value and for narrowing said interval when said value of said frequency shift is greater than said predetermined value; and wherein said interval controlling step sets said interval at a predetermined minimum value when out of synchronization is detected due to one of a failure to decode or to detect a pilot and a failure of power to reach a predetermined level.

25. A portable radio system as set forth in claim 1, wherein said received wave transmitted from said base station has a higher precision of frequency than said internal oscillator.

26. A portable radio system as set forth in claim 3, wherein said received wave transmitted from said base station has a higher precision of frequency than said internal oscillator.

27. A portable radio system as set forth in claim 6, wherein said received wave transmitted from said base station has a higher precision of frequency than said internal oscillator.

28. A portable radio equipment as set forth in claim 9, wherein said received wave transmitted from said base station has a higher precision of frequency than said internal oscillator.

29. A portable radio equipment as set forth in claim 11, wherein said received wave transmitted from said base station has a higher precision of frequency than said internal oscillator.

30. A portable radio equipment as set forth in claim 14, wherein said received wave transmitted from said base station has a higher precision of frequency than said internal oscillator.

31. A frequency error predicting method as set forth in claim 17, wherein said received wave transmitted from said base station has a higher precision of frequency than said internal oscillator.

32. A frequency error predicting method as set forth in claim 19, wherein said received wave transmitted from said base station has a higher precision of frequency than said internal oscillator.

33. A frequency error predicting method as set forth in claim 22, wherein said received wave transmitted from said base station has a higher precision of frequency than said internal oscillator.

34. A system or equipment employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises;

a first circuit which calculates a phase difference of two symbols taken from a known data modulated by said base station on the basis of a timing generated by said internal oscillator;

a second circuit which calculates a frequency shift of said internal oscillator by dividing said phase difference derived by said first circuit by an interval of said two symbols; and a third circuit which widens said interval when said phase difference derived by said calculating means is smaller than a predetermined set value, and narrows said interval when said phase difference is greater than said set value;

wherein upon calculation of arctangent by employing coordinate rotation digital computation (CORDIC), said second circuit performs calculation within a range of $\pm\pi$; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0

CORDICi=CORDICq

CORDICq=CORDICi*−1.0 phase=$\pi/2$ when CORDICi<0.0 and CORDICq<0.0,

CORDICi=CORDICq*−1.0

CORDICq=CORDICi phase=−($\pi/2$)

is performed.

35. A system or equipment employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises;

a first circuit which calculates a phase difference of two symbols taken from a known data modulated by said base station on the basis of a timing generated by said internal oscillator;

a second circuit which calculates a frequency shift of said internal oscillator by dividing said phase difference derived by said first circuit by an interval of said two symbols; and a third circuit which widens said interval when said phase difference derived by said calculating means is smaller than a predetermined set value, and narrows said interval when said phase difference is greater than said set value;

wherein upon calculation of arctangent by employing coordinate rotation digital computation (CORDIC), said second circuit performs calculation within a range of $\pm\pi$; and wherein said detecting of said frequency shift comprises deriving parameters CORDICi and CORDICq by said coordinate rotation digital computation, where a signal whose phase is to be calculated is replaced with I and Q components of said signal, and in calculation of said coordinate rotation digital computation, when a parameter for outputting a final angle by adding angles per taps is set as phase, a process expressed by:

when CORDICi<0.0 and CORDICq>0.0

CORDICi=CORDICi*−1

CORDICq=CORDICq*−1 phase=$\pi$ when CORDICi<0.0 and CORDICq<0.0,

CORDICi=CORDICi*−1

CORDICq=CORDICq*−1 phase=−$\pi$ is performed.

36. A system or equipment employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises;
- a first circuit which calculates a phase difference of two symbols taken from a known data modulated by said base station on the basis of a timing generated by said internal oscillator;
- a second circuit which calculates a frequency shift of said internal oscillator by dividing said phase difference derived by said first circuit by an interval of said two symbols; and
- a third circuit which widens said interval when said phase difference derived by said calculating means is smaller than a predetermined set value, and narrows said interval when said phase difference is greater than said set value; and
- wherein said third circuit sets said interval at a predetermined minimum value when out of synchronization is detected due to one of a failure to decode or to detect a pilot and a failure of power to reach a predetermined level.

37. A system or equipment employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises:
- a first circuit which calculates a phase difference of two symbols taken from a known data modulated by said base station on the basis of a timing generated by said internal oscillator;
- a third circuit which calculates a frequency shift of said internal oscillator by dividing said phase difference derived by said first circuit by an interval of said two symbols; and
- a third circuit which widens said interval when a value of said frequency shift derived by said second circuit is smaller than a predetermined value, and narrows said interval when said value of said frequency shift is greater than said predetermined value;
- wherein said two symbols are the same phase when a frequency of said internal oscillator is correct, and
- said first circuit derives a phase difference of said two symbols by multiplying one of said two symbols by a complex conjugate of another symbol;
- wherein upon calculation of arctangent of coordinate rotation digital computation (CORDIC), said second circuit performs calculation within a range of $\pm\pi$; and
- wherein said detecting of said frequency shift comprises deriving parameters CORDICi and CORDICq by said coordinate rotation digital computation, where
- a signal whose phase is to be calculated is replaced with I and Q components of said signal, and
- in calculation of said coordinate rotation digital computation, when a parameter for outputting a final angle by adding angles per taps is set as phase, a process expressed by:

when CORDICi<0.0 and CORDICq>0.0
CORDICi=CORDICq
CORDICq=CORDICi*−1.0
phase=$\pi/2$
when CORDICi<0.0 and CORDICq<0.0,
CORDICi=CORDICq*−1.0
CORDICq=CORDICi
phase=−($\pi/2$)
is performed.

38. A system or equipment employing an automatic frequency control for detecting a frequency shift of an internal oscillator of a portable radio equipment with reference to a received wave transmitted from a base station and adjusting the frequency of said internal oscillator by feeding back said frequency shift to said internal oscillator, wherein said portable radio equipment comprises:
- a first circuit which calculates a phase difference of two symbols taken from a known data modulated by said base station on the basis of a timing generated by said internal oscillator;
- a third circuit which calculates a frequency shift of said internal oscillator by dividing said phase difference derived by said first circuit by an interval of said two symbols; and
- a third circuit which widens said interval when a value of said frequency shift derived by said second circuit is smaller than a predetermined value, and narrows said interval when said value of said frequency shift is greater than said predetermined value;
- wherein said two symbols are the same phase when a frequency of said internal oscillator is correct, and
- said first circuit derives a phase difference of said two symbols by multiplying one of said two symbols by a complex conjugate of another symbol;
- wherein upon calculation of arctangent of coordinate rotation digital computation (CORDIC), said second circuit performs calculation within a range of $\pm\pi$; and
- wherein said detection of said frequency shift comprises deriving parameters CORDICi and CORDICq by said coordinate rotation digital computation, where
- a signal whose phase is to be calculated is replaced with I and Q components of said signal, and
- in calculation of said coordinate rotation digital computation, when a parameter for outputting a final angle by adding angles per taps is set as phase, a process expressed by:

when CORDICi<0.0 and CORDICq>0.0
CORDICi=CORDICi*−1
CORDICq=CORDICq*−1
phase=$\pi$
when CORDICi<0.0 and CORDICq<0.0,
CORDICi=CORDICi*−1
CORDICq=CORDICq*−1
phase=−$\pi$
is performed.

* * * * *